United States Patent
Lee et al.

(10) Patent No.: US 9,514,822 B2
(45) Date of Patent: Dec. 6, 2016

(54) FLASH MEMORY DEVICE

(71) Applicant: SK hynix Inc., Gyeonggi-do (KR)

(72) Inventors: Go Hyun Lee, Gyeonggi-do (KR); Jin Ho Kim, Gyeonggi-do (KR); Jae Yong Cha, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/819,184

(22) Filed: Aug. 5, 2015

(65) Prior Publication Data

US 2016/0225452 A1    Aug. 4, 2016

(30) Foreign Application Priority Data

Jan. 30, 2015    (KR) .................... 10-2015-0015283

(51) Int. Cl.
| | | |
|---|---|---|
| *G11C 16/10* | (2006.01) | |
| *G11C 16/08* | (2006.01) | |
| *G11C 16/04* | (2006.01) | |

(52) U.S. Cl.
    CPC ........... *G11C 16/08* (2013.01); *G11C 16/0483* (2013.01); *G11C 16/10* (2013.01)

(58) Field of Classification Search
    CPC ............................ G11C 16/0483; G11C 16/10
    USPC ........................ 365/185.12, 185.24
    See application file for complete search history.

(56) References Cited

U.S. PATENT DOCUMENTS

| | | | | |
|---|---|---|---|---|
| 4,481,609 | A * | 11/1984 | Higuchi | G11C 16/08 365/185.05 |
| 5,978,301 | A * | 11/1999 | Maeno | H01L 27/11807 257/E27.081 |
| 7,414,561 | B1 * | 8/2008 | Brubaker | H03M 1/0682 341/145 |
| 8,633,544 | B2 * | 1/2014 | Satoh | G11C 16/0466 257/324 |
| 8,654,595 | B2 * | 2/2014 | Kim | G11O 5/145 365/148 |
| 8,717,816 | B2 * | 5/2014 | Yano | G11C 16/08 365/185.11 |
| 8,854,888 | B2 * | 10/2014 | Chevallier | G11C 13/0007 365/185.18 |
| 8,982,603 | B2 * | 3/2015 | Azuma | G11C 11/21 365/148 |
| 2002/0064898 | A1 | 5/2002 | Adachi et al. | |
| 2002/0192887 | A1 | 12/2002 | Adachi et al. | |
| 2003/0148583 | A1 | 8/2003 | Adachi et al. | |

(Continued)

FOREIGN PATENT DOCUMENTS

| | | |
|---|---|---|
| KR | 1020060002027 | 1/2006 |
| KR | 100851857 | 8/2008 |

*Primary Examiner* — Michael Tran
(74) *Attorney, Agent, or Firm* — IP & T Group LLP

(57) ABSTRACT

A flash memory device is disclosed. The flash memory device includes: a cell array region; an X-decoder region arranged adjacent to the cell array region in a first direction; a discharge transistor region disposed between the cell array region and the X-decoder region; a first metal line formed to pass through the X-decoder region, the discharge transistor region, and the cell array region, and arranged to extend in the first direction; and a second metal line including a first line patterns arranged parallel to the first metal line between the first metal lines, and a second line pattern interconnecting both ends of the first line patterns and extending in a second direction crossing the first direction.

20 Claims, 6 Drawing Sheets

(56) References Cited

U.S. PATENT DOCUMENTS

| | | |
|---|---|---|
| 2004/0253788 A1 | 12/2004 | Adachi et al. |
| 2005/0090058 A1 | 4/2005 | Adachi et al. |
| 2005/0098823 A1 | 5/2005 | Adachi et al. |
| 2005/0189579 A1 | 9/2005 | Adachi et al. |
| 2005/0226048 A1* | 10/2005 | Lee ................ G11C 16/24 365/185.17 |
| 2006/0051977 A1 | 3/2006 | Adachi et al. |
| 2007/0025150 A9* | 2/2007 | Lee ................. G11C 8/08 365/185.11 |
| 2007/0053227 A1* | 3/2007 | Ragone ............ G11C 5/145 365/189.09 |
| 2008/0123434 A1 | 5/2008 | Kuriyama et al. |
| 2009/0230453 A1 | 9/2009 | Adachi et al. |
| 2011/0290984 A1* | 12/2011 | Julien ............ H01L 27/14609 250/208.1 |
| 2012/0224411 A1* | 9/2012 | Kanno ............ G11C 13/0002 365/148 |

* cited by examiner

FLASH MEMORY DEVICE

CROSS-REFERENCE TO RELATED APPLICATION

This application claims priority to Korean patent application No. 10-2015-0015283, filed on 30 Jan., 2015, the disclosure of which is hereby incorporated in its entirety by reference.

BACKGROUND OF THE INVENTION

1. Field

Embodiments of the present invention relate to a flash memory device and, more particularly, to a technology for changing a shape of a source line and an arrangement structure of a discharge region.

2. Description of the Related Art

A NAND flash memory serving as a non-volatile semiconductor memory device has integration and memory capacity that meet the requirements of dynamic random access memories (DRAMs), so that the usage and availability of NAND flash memory is rapidly increasing. NAND flash memory is generally configured in a structure where a memory string and memory cells are connected in series and coupled between a bit line and a source line. Many memory strings are then arranged to form a memory cell array.

A conventional ash memory device according to the related art will hereinafter be described with reference to FIGS. 1 and 2.

FIG. 1 is a circuit diagram illustrating a conventional flash memory device, and FIG. 2 is a layout diagram illustrating the conventional flash memory device of FIG. 1.

Referring to FIG. 1, the flash memory device includes a cell array region in which a plurality of memory blocks BLK are disposed.

The memory blocks BLK include a plurality of word lines WL and a plurality of bit lines BL, and the word lines WL and the bit lines BL arranged to cross each other.

Conventionally, a source line (SL) discharge transistor (TR) region is arranged adjacent to the cell array region in a bit line direction as shown in FIGS. 1 and 2.

The SL discharge TR region may include a plurality of gate electrodes and source/drain junction regions. A first source line SL1 extending in a word line direction is disposed between memory blocks BLK and coupled to source selection transistors SST of the memory blocks BLK. The memory blocks BLK of the cell array region are coupled to the source junction region of the SL discharge TR region through a second source line SL2 that is coupled to the first source line SL1.

In this example, the second source line SL2 may be formed in a mesh-shaped pattern in which line patterns are formed to cross each other in a lattice shape as shown in FIG. 2.

An X-decoder region is arranged adjacent to the cell array region in the word line direction. The X-decoder region may include a decoder switch DEC_SW and a pass transistor PASS TR. The decoder switch DEC_SW includes a block word line BLKWL, the block word line BLKWL may be coupled to gate electrodes of the pass transistor PASS TR composed of high-voltage transistors. Since the second source line SL2 formed in the mesh-shaped pattern is formed in the cell array region, it is difficult to implement a structure in which the block word line BLKWL passes through the cell array regions.

Therefore, a decoder switch DEC_SW is required for each pass transistor PASS TR, and it is difficult to share the pass transistors PASS TR among the cell array regions so that the memory device unavoidably increases in size.

BRIEF SUMMARY OF THE INVENTION

Various embodiments of the present disclosure are directed to a flash memory device that substantially obviates one or more problems, limitations, or disadvantages of the related art.

An embodiment relates to a flash memory device in which a source line shape is changed, a discharge transistor is disposed between a cell array region and an X-decoder region, and at the same time a block word line passing through the cell away region may be implemented.

In accordance with an aspect of the present disclosure, a flash memory device includes: a cell array region; an X-decoder region arranged adjacent to the cell array region in a first direction; a discharge transistor region disposed between the cell array region and the X-decoder region; a first metal line formed to pass through the X-decoder region, the discharge transistor region, and the cell array region, and arranged to extend in the first direction; and a second metal line including first line patterns arranged parallel to the first metal line between the first metal lines, and a second line pattern interconnecting both ends of the first line patterns and extending in a second direction crossing the first direction.

The X-decoder region may include a block switch and a pass transistor. The block switch and the pass transistor may respectively include a block word line and a gate electrode.

The cell array region may include a bit line extending in the second direction. The cell array region may further include a word line formed to extend in the first direction. The word line may be a multi-layered structure in which an insulation film and a conductive material are alternately stacked.

The flash memory device may further include: a plurality of channel regions formed to pass through the multi-layered word line. The flash memory device may further include: a source contact plug and a drain contact plug coupled to the plurality of channel regions.

The source contact plug may be coupled to a source line, and the drain contact plug may be coupled to a bit line.

The bit line may be located at an upper level of the source line. The discharge transistor region may include one or more gate electrodes and source/drain regions.

The first metal line may be a block word line coupled to a gate electrode of a pass transistor disposed in the X-decoder region. The second metal line may be a source line.

The first metal line and the second meta line may be located at the same layer. The second metal line may be coupled to a source line discharge transistor disposed in the discharge transistor region. The second metal line may be located over a bit line disposed in the cell array region.

The flash memory device may further include: a third metal line formed adjacent to the cell array region in the second direction at both sides of the cell array region, and formed to extend in the first direction. The third metal line may be coupled to a source line discharge transistor disposed in the discharge transistor region, and receive a ground voltage as an input.

The first metal line may be formed to interconnect a plurality of pass transistors.

The flash memory device may further include: a page buffer region formed at one side of the cell region arranged in the second direction.

It is to be understood that both the foregoing general description and the following detailed description are exemplary and explanatory and are intended to explain the claims.

DESCRIPTION OF EMBODIMENTS

Reference will now be made in detail to embodiments that will be illustrated in the accompanying drawings. Wherever possible, the same reference numbers will be used throughout the drawings to refer to the same or like parts. In the following description, a detailed description of related known configurations or functions incorporated herein will be omitted when it may make the subject matter less clear.

Figure 1:
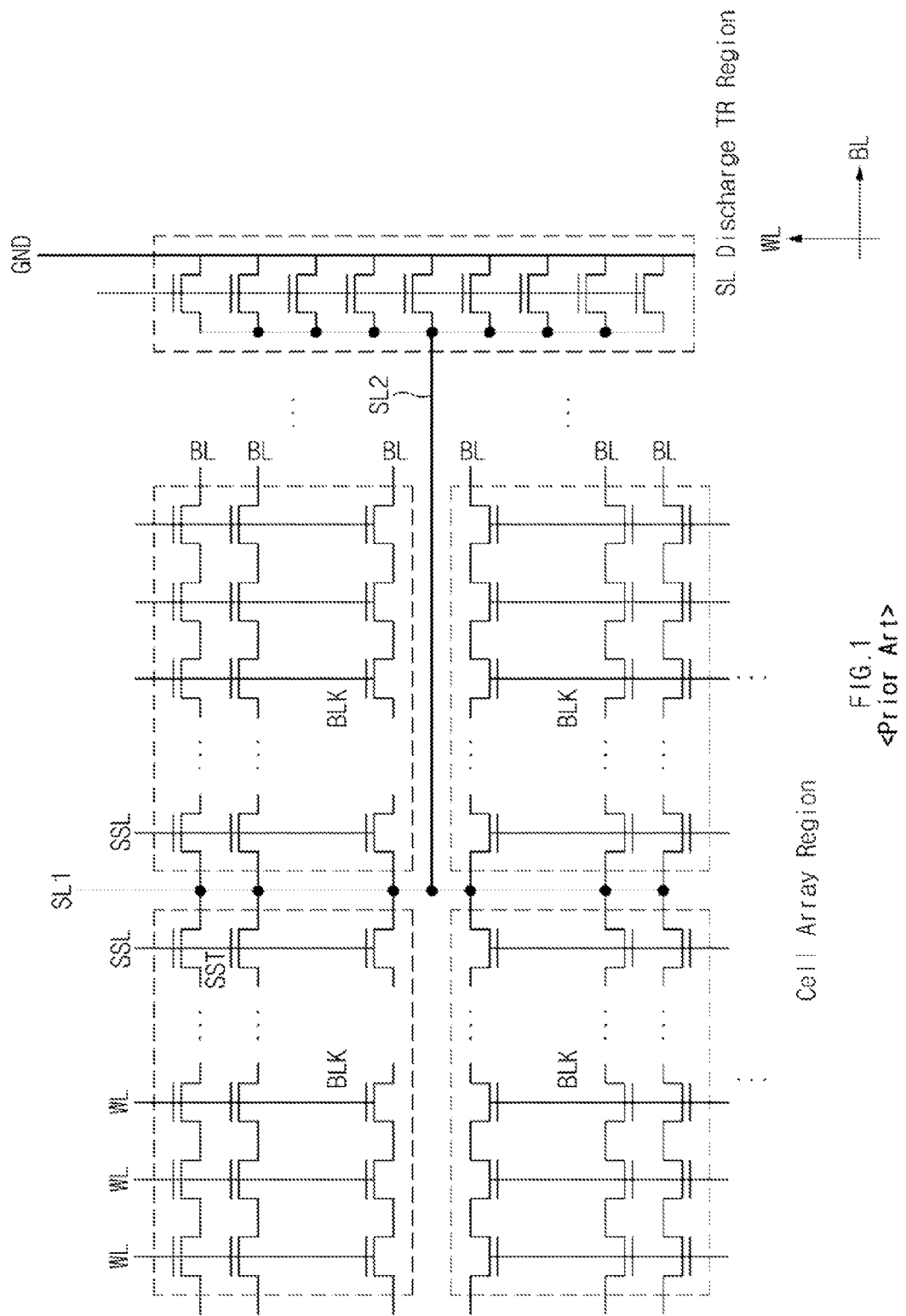
FIG. 1 is a circuit diagram illustrating a conventional flash memory device.
Figure 2:
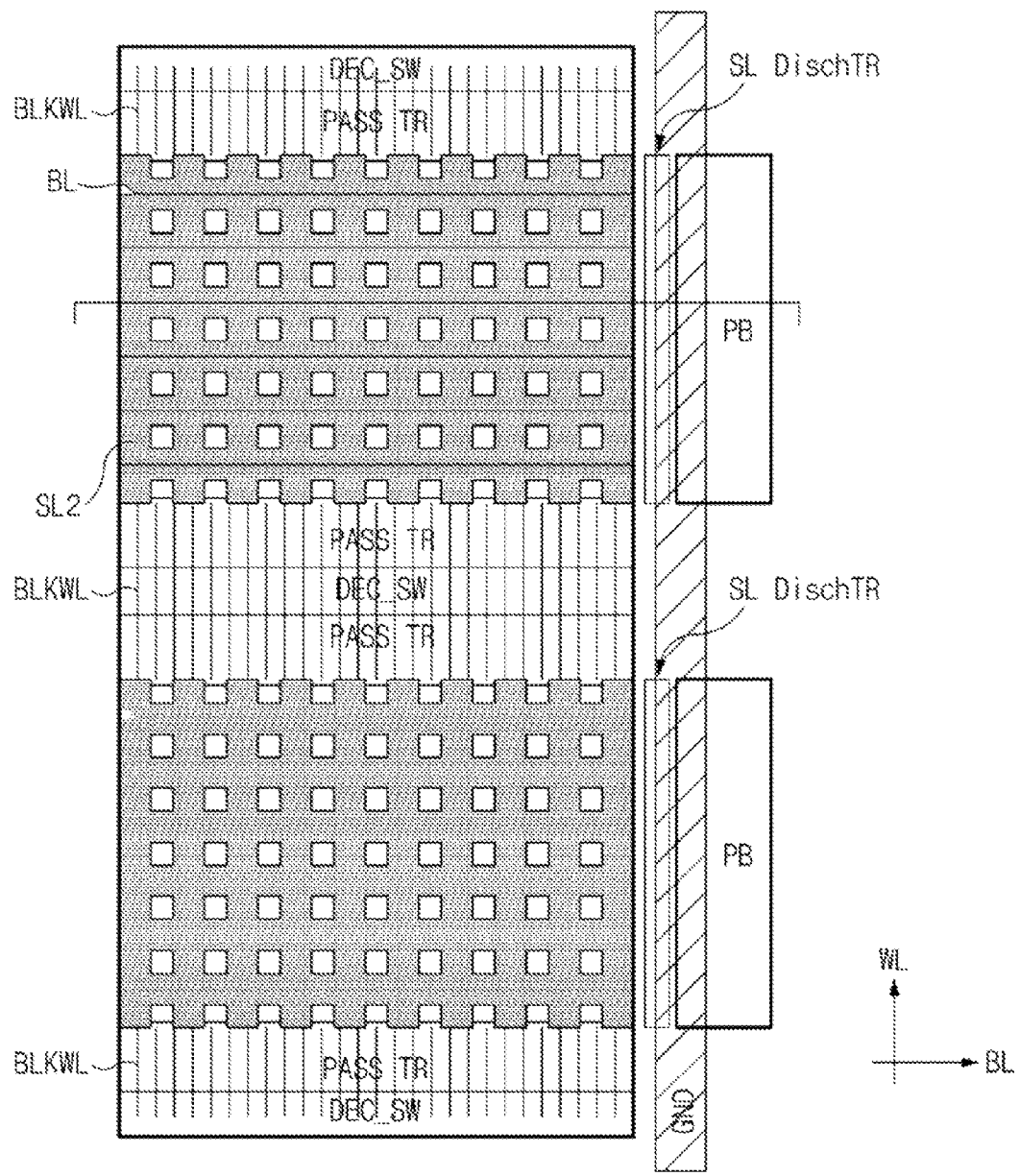
FIG. 2 is a layout diagram illustrating the conventional flash memory device of FIG. 1.
Figure 3:
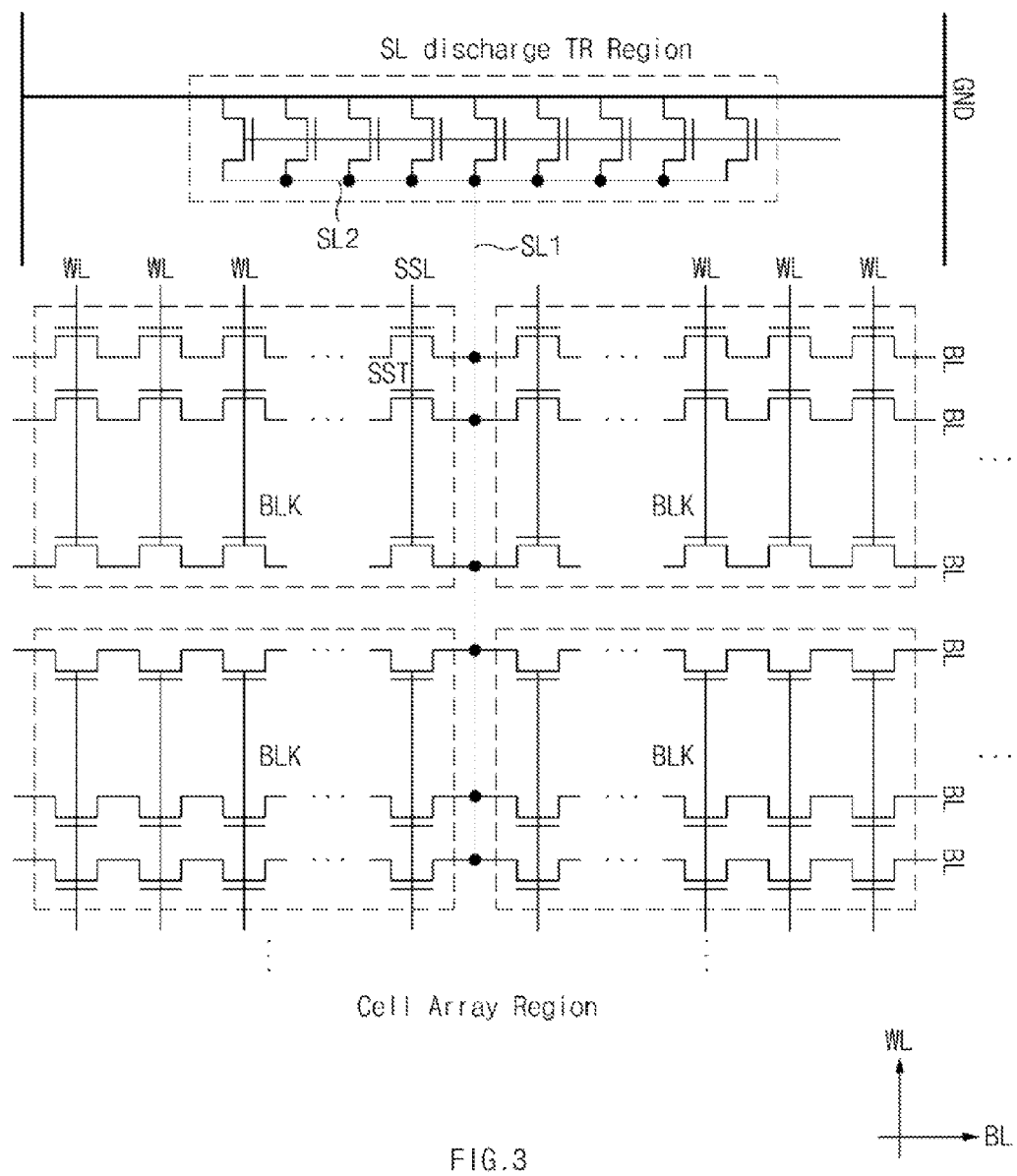
FIG. 3 is a circuit diagram illustrating a flash memory device according to an embodiment of the present disclosure.

FIG. 3 is a circuit diagram illustrating a flash memory device according to an embodiment of the present disclosure.

Referring to FIG. 3, the flash memory device includes a plurality of cell array regions, and each cell array region includes a plurality of memory blocks BLK.

The memory blocks BLK include a plurality of word lines WL and a plurality of bit lines BL, and the word lines WL and the bit lines BL may be formed to cross each other.

In addition, a source line (SL) discharge transistor (TR) region is arranged adjacent to the cell array region in a word line direction. The SL discharge TR region includes a plurality of source line (SL) discharge transistors which are arranged adjacent to each other in a bit line direction. Although not shown in FIG. 3, an X-decoder region may be arranged adjacent to the SL discharge TR region in the word line direction.

The SL discharge transistors include a plurality of gate electrodes, and source/drain junction regions are formed at both sides of each gate electrode.

The source junction region of the SL discharge transistors is coupled to a second source line SL2 extending in the bit line direction, and the second source line SL2 is coupled to a first source line SL1, i.e., a common source line (SL), configured to pass between the memory blocks BLK. The first source line SL1 extends in the word line direction and is coupled to source selection transistors SST of the memory blocks BLK.

In addition, the drain junction region of the SL discharge transistors is coupled to a ground line GND at both sides of the cell array region. As described above, since the ground line GND is disposed at both sides of the cell array region, resistance from the ground line GND to the first source line SL1 of the cell array region may be reduced during a discharge operation.

Figure 4:
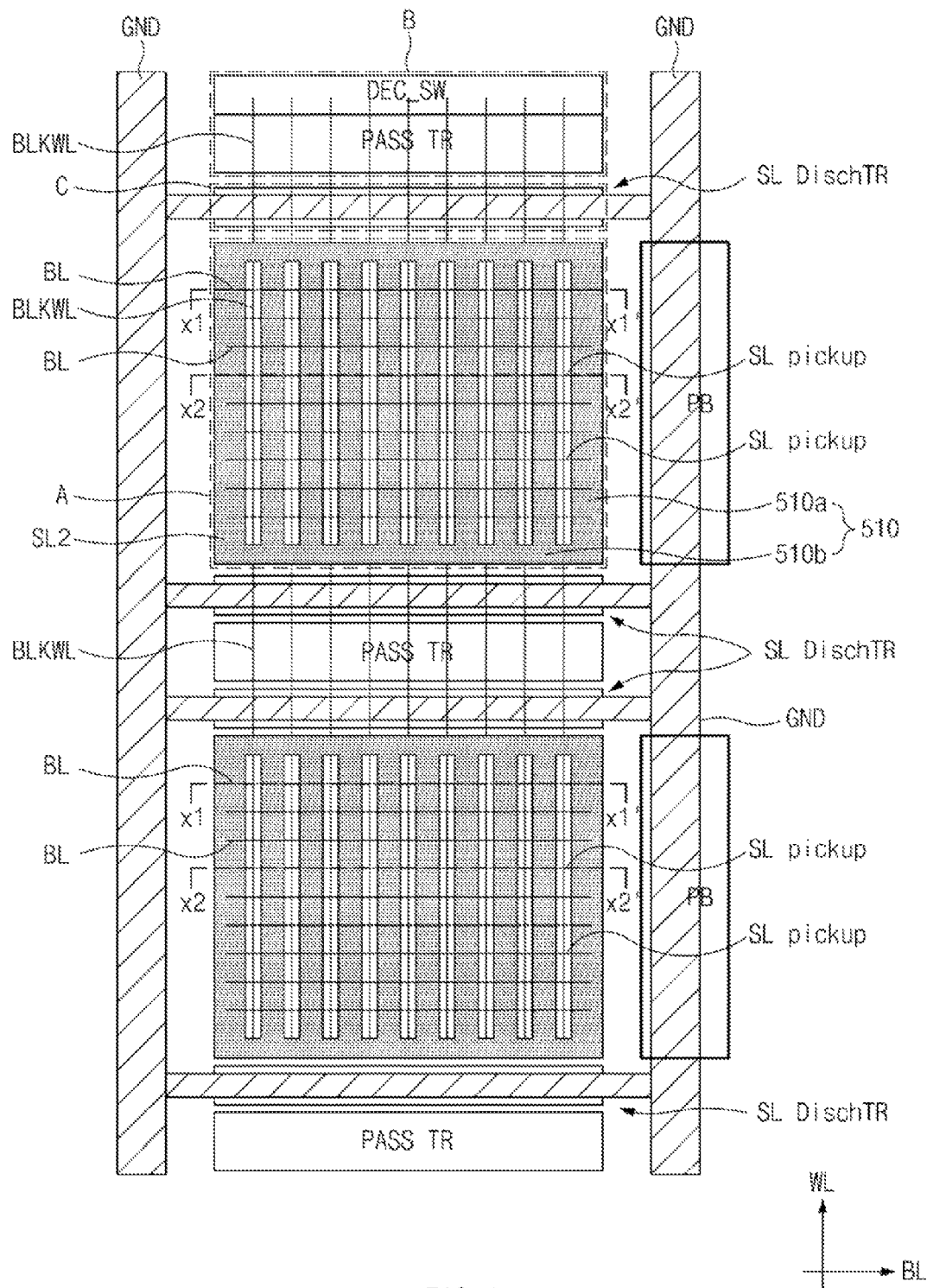
FIG. 4 is a layout diagram illustrating a flash memory device according to an embodiment of the present disclosure.

FIG. 4 is a schematic diagram illustrating a flash memory device according to an embodiment of the present disclosure.

Referring to FIG. 4, the flash memory device includes a plurality of cell array regions A. An X-decoder region B is arranged adjacent to the cell array region A in a first direction, i.e., a word line direction.

The X-decoder region B may apply operation voltages to a plurality of word lines WL and a drain and source selection line SSL based on a row address from a control circuit (not, shown).

The X-decoder region B includes a decoder switch DEC_SW and a pass transistor PASS TR.

The decoder switch DEC_SW may include a block word line BLKWL, and the block word line BLKWL may be coupled to gate electrodes of the pass transistor PASS TR composed of high-voltage transistors.

The pass transistor PASS TR performs a switching operation for applying a predetermined voltage to the word line WL of the cell array region A, and the pass transistors PASS TR are turned on when the block word line BLKWL is precharged to an operation voltage (VPP) level.

A SL discharge TR region C may be disposed between the cell array region A and the X-decoder region B. Although not shown in FIG. 4, the SL discharge TR region C may include a plurality of source line (SL) discharge transistors SL Disch TR. The SL discharge transistors SL Disch TR may include a plurality of gate electrodes and source/drain junction regions formed at both sides of the gate electrodes.

The flash memory device may further include a page buffer region PB formed at one side of the cell region A in a second direction, i.e., a bit line direction.

The block word lines BLKWL extending in the first direction are arranged to pass through the pass transistor PASS TR in the X-decoder region B, the SL discharge transistors SL Disch TR in the SL discharge TR region C, and the cell array region A. The block word lines BLKWL may pass through the plurality of cell array regions A adjacent to each other in the word line direction. Therefore, the pass transistor PASS TR of the X-decoder region B may be controlled by one block word line BLKWL.

Since the pass transistor PASS TR is controlled by one block word line BLKWL, the decoder switch DEC_SW corresponding to each pass transistor PASS TR may be omitted. Referring to FIG. 4, it can be recognized that the decoder switch DEC_SW for controlling the pass transistor PASS TR formed between the cell array regions A is omitted. As described above, the X-decoder region B may be reduced in size because the decoder switch DEC_SW may be omitted.

In addition, the cell array region A may further include a plurality of bit lines BL formed to cross the block word lines BLKWL. The bit lines BL may be formed to extend in the second direction crossing the block word lines BLKWL.

Though it is not shown in FIG. 4, a second source line SL2 connected to a first source line SL1, i.e., a common source line (SL), is arranged in the cell array region A through a source pickup region SL Pick UP. The bit lines BL may be used as a source pickup region formed to interconnect the first source line SL1 and the second source line SL2 in a line-by-line manner for each section. For example, one line for every three bit lines may be used as a source pickup region. However, the position of the source pickup region is not limited thereto, and may also be changed according to the number of bit lines without departing from the scope or spirit of the present disclosure.

A second source line 510 may include a plurality of first line patterns 510b formed to extend in the first direction, i.e., the word line direction, between the plurality of block word lines BLKWL; and a second line pattern 510a formed to interconnect both ends of the first line patterns 510b at an edge portion of the cell array region A, and extended in the second direction, i.e., the bit line direction. That is, the second source line 510 is formed by removing a pattern of the portion extended in the bit line direction from the conventional mesh shape.

Each of the SL discharge transistors SL Disch TR may include the gate electrode and the source/drain junction regions arranged at both sides of the gate electrode. The drain junction region of the SL discharge transistors SL Disch TR is coupled to the ground line GND arranged at both sides of the cell array region. The source junction region of the SL discharge transistors SL Disch TR is coupled to the second source line SL2 arranged in the cell array region.

As described above, the SL discharge TR region is arranged adjacent to the cell array region in the word line direction, and bit line-directional patterns are removed from the used mesh-shaped source lines, so that it is possible to implement a specific structure in which block word lines pass through the cell array region without the addition of a metal line.

In addition the pass transistor may be shared between the cell array regions, and there is no need to arrange a separate decoder switch in each pass transistor. That is, the X-decoder region may be reduced in size due to omission of the decoder switch.

Figure 5A:
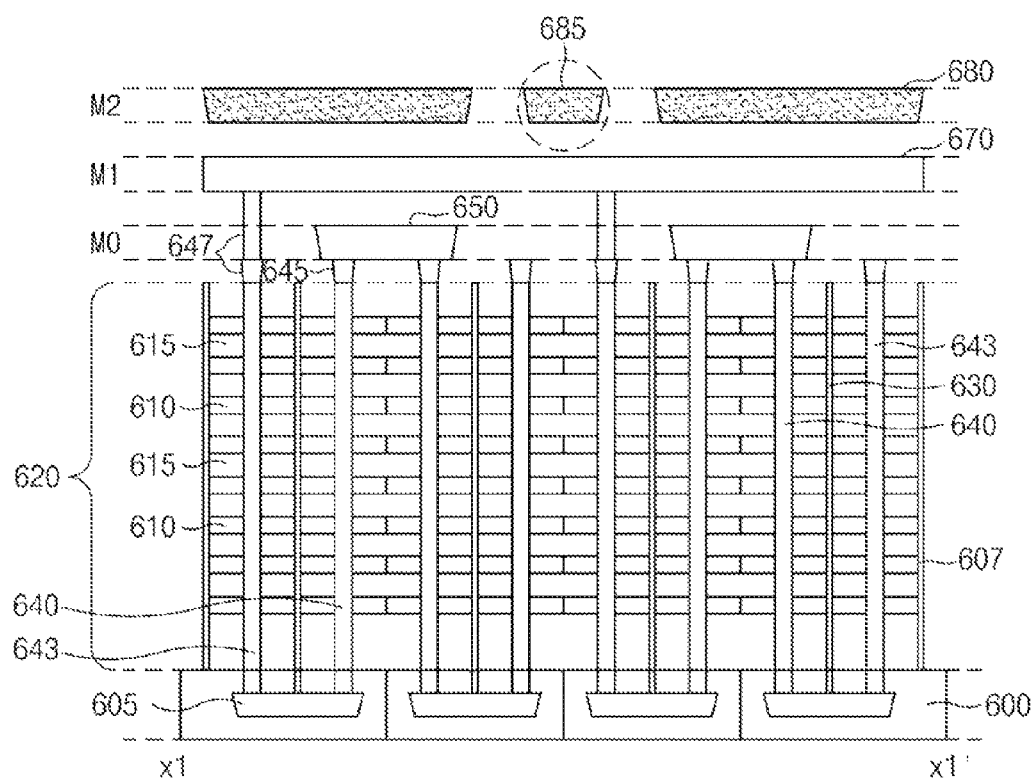
FIGS. 5A and 5B are cross-sectional views illustrating a flash memory device according to an embodiment of the present disclosure.
Figure 5B:
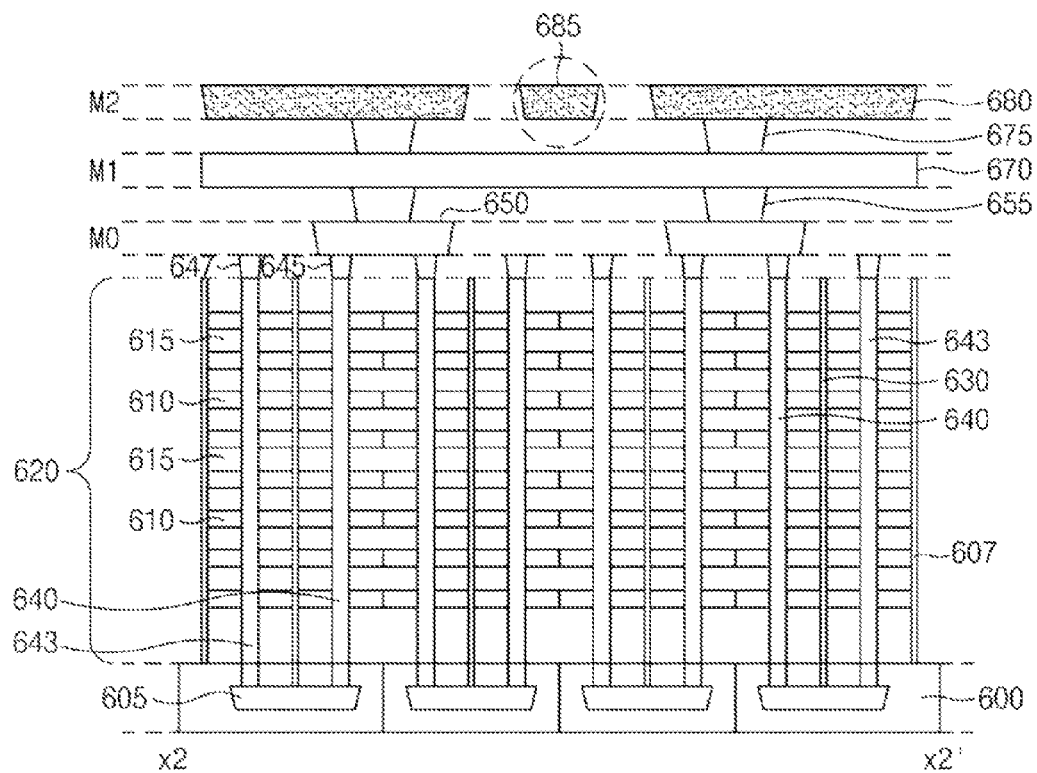

FIGS. 5A and 5B are cross-sectional views illustrating a flash memory device according to an embodiment of the present disclosure. FIG. 5A is a cross-sectional view illustrating the flash memory device taken along the line X1-X1' of FIG. 4, and FIG. 5B is a cross-sectional view illustrating the flash memory device taken along the line X2-X2'. FIG. 5A is a cross-sectional view illustrating the flash memory device taken along the line X1-X1' showing a bit line (BL) area, and FIG. 5B is a cross-sectional view illustrating the flash memory device taken along the line X2-X2' and showing a source pickup line (SL Pick Up) area.

Referring to FIG. 5A, a multi-layered word line 620 is formed over a semiconductor substrate 600 including a pipe channel portion 605. The multi-layered word line 620 may be formed by alternately stacking a word line conductive material 610 and an insulation material 615. FIGS. 5A and 5B illustrate one memory block, and this memory block shown in FIG. 5A or 5B may include a first slit 607 for classifying individual memory blocks.

A first channel region 640 and a second channel region 643 coupled to the pipe channel portion 605 are formed to pass through the multi-layered word line 620. In addition, a second slit 630 for isolating the word line 620 from a pipe-type cell may be disposed between the first channel region 640 and the second channel region 643.

The first channel region 640 may be coupled to the first source line 650 through a source contact plug 645. The second channel region 643 may be coupled to a bit line 670 formed over an upper layer of the first source line 650 through a drain contact plug 647.

A second source line 680 is formed over an upper layer of the bit line 670. As can be seen from FIG. 4, the second source line 680 may include a plurality of first line patterns (510b of FIG. 4) extending in an extension direction of the word line; and a second line pattern (510a of 4) formed to interconnect both ends of the first line patterns and extended in a direction of the bit line.

A block word line 685 parallel to the first line pattern is formed among the first line patterns of the second source line 680. The block word line 685 is formed over the same layer as in the second source line 680, so that an additional metal line to be used as a block word line need not be formed.

Referring to FIG. 5B, a first contact plug 655 connected to the bit line 670 is formed over the source line 650. A second contact plug 675 connected to the second source line 680 is formed over the bit line 670. As described above, some parts from the bit lines are selected so that the selected bit lines may be used to interconnect the first source line and the second source line.

As described above, the SL discharge TR region is arranged adjacent to the cell array region in the word line direction, and the bit line-directional patterns are removed from the used mesh-shaped source lines, so that it is possible to implement a specific structure in which the block word lines pass through the cell array region without addition of a metal line.

It is also possible to share a pass transistor disposed between the cell array regions, and a decoder switch corresponding to each pass transistor need not be used. Accordingly, the decoder switch is omitted so that an X-decoder region may be reduced in size.

As is apparent from the above description, a flash memory device according to the embodiments may provide one or more of the following effects.

First, a source line is modified in shape and the position of a source line (SL) discharge transistor (TR) region is changed, so that a block word line may be used as a conventional metal line. Therefore, the block word line passing through the cell array region may be formed without adding a separate metal line.

Second, it is possible to share a pass transistor disposed between the cell array regions, and there does not need to be a decoder switch corresponding to each pass transistor. Accordingly, the decoder switch is omitted so that an X-decoder region may be reduced in size.

Those skilled in the art will appreciate that embodiments of the present disclosure may be carried out in other ways than those set forth herein without departing from the scope and characteristics of these embodiments.

The above embodiments of the present disclosure are intended to be illustrative and not limitative. Various alternatives and equivalents are possible. The invention is not limited by the type of deposition, etching, polishing, and patterning steps described herein. Nor are embodiments limited to any specific type of semiconductor devices. For example, embodiments may be implemented in a dynamic random access memory (DRAM) device or a non-volatile memory device. Other additions, subtractions, or modifications are obvious in view of the present disclosure and are intended to fall within the scope of the appended claims.

What is claimed is:

1. A flash memory device comprising:
   a cell array region;
   an X-decoder region arranged adjacent to the cell array region in a first direction;
   a discharge transistor region disposed between the cell array region and the X-decoder region;
   a first metal line formed to pass through the X-decoder region, the discharge transistor region, and the cell array region, and arranged to extend in the first direction; and a second metal line including first line patterns arranged parallel to the first metal line between the first metal lines, and a second line pattern interconnecting both ends of the first line patterns and extending in a second direction crossing the first direction.

2. The flash memory device according to claim 1, wherein the X-decoder region includes a block switch and a pass transistor.

3. The flash memory device according to claim 2, wherein the block switch and the pass transistor respectively include a block word line and a gate electrode.

4. The flash memory device according to claim 1, wherein the cell array region includes a bit line extending in the second direction.

5. The flash memory device according to claim 4, wherein the cell array region further includes:
a word line formed to extend in the first direction.

6. The flash memory device according to claim 5, wherein the word line is a multi-layered structure in which an insulation film and a conductive material are alternately stacked.

7. The flash memory device according to claim 6, further comprising:
a plurality of channel regions formed to pass through the multi-layered word line.

8. The flash memory device according to claim 7, further comprising:
a source contact plug and a drain contact plug respectively coupled to the plurality of channel regions.

9. The flash memory device according to claim 8, wherein the source contact plug is coupled to a source line, and the drain contact plug is coupled to a bit line.

10. The flash memory device according to claim 9, wherein the bit line is located at an upper level of the source line.

11. The flash memory device according to claim 1, wherein the discharge transistor region includes one or more gate electrodes and source/drain regions.

12. The flash memory device according to claim 1, wherein the first metal line is a block word line coupled to a gate electrode of a pass transistor disposed in the X-decoder region.

13. The flash memory device according to claim 1, wherein the second metal line is a source line.

14. The flash memory device according to claim 1, wherein the first metal line and the second metal line are located in the same layer.

15. The flash memory device according to claim 1, wherein the second metal line is coupled to a source line discharge transistor disposed in the discharge transistor region.

16. The flash memory device according to claim 1, wherein the second metal line is located over a bit line disposed in the cell array region.

17. The flash memory device according to claim 1, further comprising:
a third metal line formed adjacent to the cell array region in the second direction at both sides of the cell array region, and formed to extend in the first direction.

18. The flash memory device according to claim 17, wherein the third metal line is coupled to a source line discharge transistor disposed in the discharge transistor region, and receives a ground voltage as an input.

19. The flash memory device according to claim 1, wherein the first metal line is formed to interconnect a plurality of pass transistors.

20. The flash memory device according to claim 1, further comprising:
a page buffer region formed at one side of the cell region in the second direction.

* * * * *